United States Patent [19]

Berchin

[11] Patent Number: 5,375,067
[45] Date of Patent: Dec. 20, 1994

[54] METHOD AND APPARATUS FOR ADJUSTMENT OF ACQUISITION PARAMETERS IN A DATA ACQUISITION SYSTEM SUCH AS A DIGITAL OSCILLOSCOPE

[75] Inventor: Gregory J. Berchin, Glen Ellyn, Ill.

[73] Assignee: Nicolet Instrument Corporation, Madison, Wis.

[21] Appl. No.: 989,334

[22] Filed: Dec. 11, 1992

[51] Int. Cl.$^5$ .................. G06F 15/31; G01R 13/28
[52] U.S. Cl. ..................... 364/487; 364/179; 324/74; 324/121 R
[58] Field of Search ........... 364/487, 484, 570, 571.01, 364/571.02, 571.04, 179; 324/74, 121 R, 115; 341/139, 123

[56] References Cited

U.S. PATENT DOCUMENTS

| | | | |
|---|---|---|---|
| 4,553,091 | 11/1985 | Bristol | 324/74 |
| 4,716,345 | 12/1987 | Shank et al. | 315/392 |
| 4,719,416 | 1/1988 | Desautels | 324/121 R |
| 4,743,844 | 5/1988 | Odenheimer et al. | 324/121 R |
| 4,779,045 | 10/1988 | Shank | 324/121 R |
| 4,799,165 | 1/1989 | Hollister et al. | 364/487 |
| 4,802,098 | 1/1989 | Hansen et al. | 364/487 |
| 4,958,139 | 9/1990 | Hyatt | 340/122 |
| 5,155,431 | 10/1992 | Holcomb | 324/121 R |
| 5,184,062 | 2/1993 | Ladwig | 324/74 |
| 5,227,716 | 7/1993 | Olde Heuvel | 364/487 |

OTHER PUBLICATIONS

David O. Smallwood, "Characterizing Transient Vibrations Using Band Limited Moments", Proceedings of the 60th Shock and Vibration Symposium, Virginia Beach, Virginia, Nov., 1989, pp. 93–109.

*Primary Examiner*—Thomas G. Black
*Assistant Examiner*—Tan Q. Nguyen
*Attorney, Agent, or Firm*—Foley & Lardner

[57] ABSTRACT

A data acquisition system such as a digital oscilloscope includes a central processing unit which controls the waveform memory, analog to digital converter, trigger generator, and display to automatically adjust the acquisition parameters to optimal values for a particular repetitive waveform received by the data acquisition system. The system initially optimizes the acquisition parameters for determining the length of the input waveform and then determines the input waveform length. Parameters are then determined for best frequency analysis of the input waveform, and the waveform is then frequency analyzed to determine its spectral content. Based on this information, the acquisition parameters are adjusted such that the sampling rate is sufficient to avoid aliasing of the highest significant frequency components of the input waveform while accommodating all or substantially all of the waveform within the memory capacity of the waveform memory, and the voltage range of the analog to digital converter is set so that the range of the input signal will substantially match the input range of the converter.

24 Claims, 7 Drawing Sheets

METHOD AND APPARATUS FOR ADJUSTMENT OF ACQUISITION PARAMETERS IN A DATA ACQUISITION SYSTEM SUCH AS A DIGITAL OSCILLOSCOPE

FIELD OF THE INVENTION

The present invention is generally directed to data acquisition systems and more particularly to data acquisition systems such as digital oscilloscopes which automatically adjust acquisition parameters.

BACKGROUND OF THE INVENTION

Many prior art data acquisition devices, such as digital storage oscilloscopes, require that their acquisition parameters be adjusted. Their acquisition parameters, including trigger level, voltage range, number of points (record length), sampling rate, and the pre-trigger amount, have optimal values for the equipment being used and the waveform or input signal being acquired. For example, the voltage range used to acquire an input signal should be greater than the magnitude range which the input signal spans to acquire the entire signal without clipping of the maximum and/or minimum data points. However, increasing the voltage range decreases the resolution in most systems. Therefore, the optimal voltage range is the smallest range that does not clip the input signal.

Optimal values for other parameters must be determined together. For example, the sampling rate and record length should be selected together such that the sampling rate is as fast as necessary to prevent aliasing, but slow enough to record the entire waveform for the selected record length.

Many prior art data acquisition systems require that the acquisition parameters be manually adjusted. This requires either advance knowledge of the input waveform before acquisition begins or the ability to adjust the acquisition parameters in response to data acquired. For example, if a periodic waveform is being acquired, the user may set the acquisition parameters to initial values, acquire data, adjust the acquisition parameters, to acquire data, etc., until the user is satisfied that the acquisition parameters are optimal for the waveform being acquired. This manual process may be slow, inaccurate and difficult to perform properly.

Other prior instruments include autosetting features wherein a microprocessor within the oscilloscope analyzes data acquired and adjusts its acquisition parameters accordingly. However, prior oscilloscopes which automatically adjust their acquisition parameters generally are not able to adjust them rapidly enough that data may be acquired both accurately and without significant delay. Accordingly, the need exists for an data acquisition system which quickly and accurately adjusts its acquisition parameters.

SUMMARY OF THE INVENTION

In accordance with the present invention a data acquisition device includes an analog to digital converter having an input and an output, a microprocessor or central processing unit (CPU) having a data input coupled to the output of the analog to digital converter for receiving an input waveform, and further having a data output. The CPU sets initial values for acquisition parameters, determines the length and rms duration of the input waveform, performs spectral analysis on the input waveform, and optimizes the acquisition parameters for the input waveform. A memory device is coupled to the data output of the CPU.

The invention also encompasses a method of setting acquisition parameters for a data acquisition system including the steps of setting initial values for the acquisition parameters and acquiring an input waveform, analyzing the acquired data, and adjusting the acquisition parameters in response to the acquired data to values more desirable for determining the length of the input waveform. The steps of acquiring data and optimizing the acquisition parameters for determining length are repeated until the acquisition parameters have optimal values for determining the length of the input waveform, and then the length of the input waveform is determined. The step of analyzing the acquired data and adjusting the acquisition parameters in response to the acquired data to values more desirable for frequency analyzing the input waveform are performed and repeated until the acquisition parameters have optimal values for frequency analyzing of the input waveform. The input waveform is then frequency analyzed and the acquisition parameters are adjusted to values optimal for acquiring the input waveform.

Further objects, features and advantages of the invention will be apparent from the following detailed description when taken in conjunction with the accompanying drawings.

DETAILED DESCRIPTION OF THE INVENTION

Figure 1:
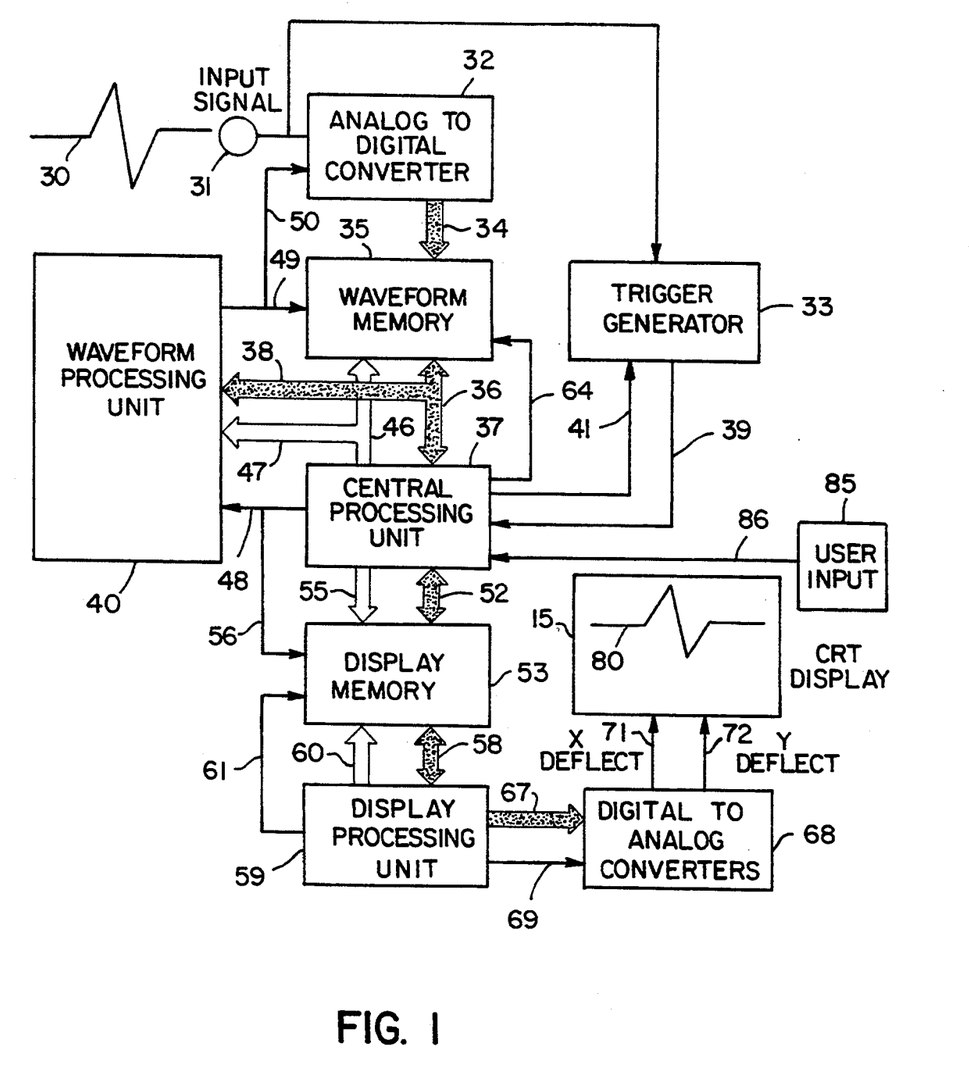
FIG. 1 is a block diagram of a data acquisition system constructed in accordance with the present invention.

The present invention is directed to a method and apparatus for digital data acquisition as exemplified by a digital storage oscilloscope. A simplified illustrative block diagram of a digital oscilloscope apparatus which carries out the present invention is shown in FIG. 1. An analog input signal 30, which may be a time varying voltage, is received at an input terminal 31 which may include input conditioning circuitry, and the conditioned analog signal is provided to an analog-to-digital converter 32. The converter 32 provides multi-bit digital data on a data bus 34 to a waveform memory 35 where the data is assigned and written sequentially to memory positions over the period of time during which the input signal is sampled and acquired. Circuitry 33 is connected to receive the signal from the input terminal 31 for triggering on input signal 30 to begin storage of waveform data in the waveform memory 35, and may be of conventional design well known in the art. The trigger signal from the trigger generator circuitry 33 is provided to the CPU 37 by a line 39 and receives control signals from the CPU on lines The waveform memory 35 is in communication via data bus lines 36 to a central processing unit 37 and via data bus lines 38 to a waveform processing unit 40 of conventional design. The waveform processing unit 40 is of conventional technology capable of recording and recalling data collections. Its responsibilities include the writing of collected data points into the waveform memory 35 and remembering where the first point in the collection was written. This information is read by the central processing unit 37 and used to generate the display shown on the CRT screen 15. The central processing unit (CPU) controller 37 (e.g., a Motorola 68010 running with a 10 MHz clock) controls the writing of data into the waveform memory 35 and the reading of data from the memory via address bus lines 46 and the transfer of data to the waveform processing unit via an extension of the address bus lines 47. The control of the waveform processing 40 is also provided from the central processing unit signals on control lines 48, with control lines 49 and extending from the waveform processing unit to the waveform memory 35 and the analog-to-digital converter 32.

Data from the CPU 37 is provided on data bus lines 52 to a display memory 53, with the writing of data into and reading of data out of the display memory being controlled from the central processing unit via address bus lines 55 and control lines 56. Output data read from the display memory 53 is provided on data bus lines 58 to a display processing unit 59 which controls the reading of this data via an address bus 60 and control lines 61. The CPU 37 also provides control signals to the waveform memory 35 via control lines 64. The display may be generated in a conventional fashion, such as by vectored deflection, although a raster scanned display may also be used if desired.

The data from the display processing unit 59 is provided in digital form on a data bus 67 to a digital-to-analog converter 68 which is also controlled by the display processing unit 59 by signals passed over control lines 69. The digital-to-analog converter 68 provides an X deflection signal on a line 71 and a Y deflection signal on a line 72 to the cathode ray tube display unit 15 which includes conventional vertical and horizontal amplifiers and a cathode ray tube which generates a visual display on the CRT screen of the waveform 80 (corresponding to data sampled from the analog input signal 30). Commands from the user are provided through a user input interface 85 which provides control signals on control lines 86 to the CPU 37.

All of the elements of the digital oscilloscope apparatus described above with respect to FIG. 1 are conventional and well known in the art and are described as shown to illustrate the invention, although it is understood that other arrangements for computer controlled data acquisition systems may also be utilized in the present invention. In the present invention, the data stored in the waveform memory 35 is analyzed by the CPU 37 in accordance with a program stored in its internal memory to adjust the acquisition parameters to the optimal values most appropriate for the input waveform. Because the CPU adjusts the acquisition parameters using an iterative process, the input waveform must be periodic. If a different periodic input waveform is subsequently acquired, the acquisition parameters are readjusted to the optimal values for the new input waveform.

Figure 2:
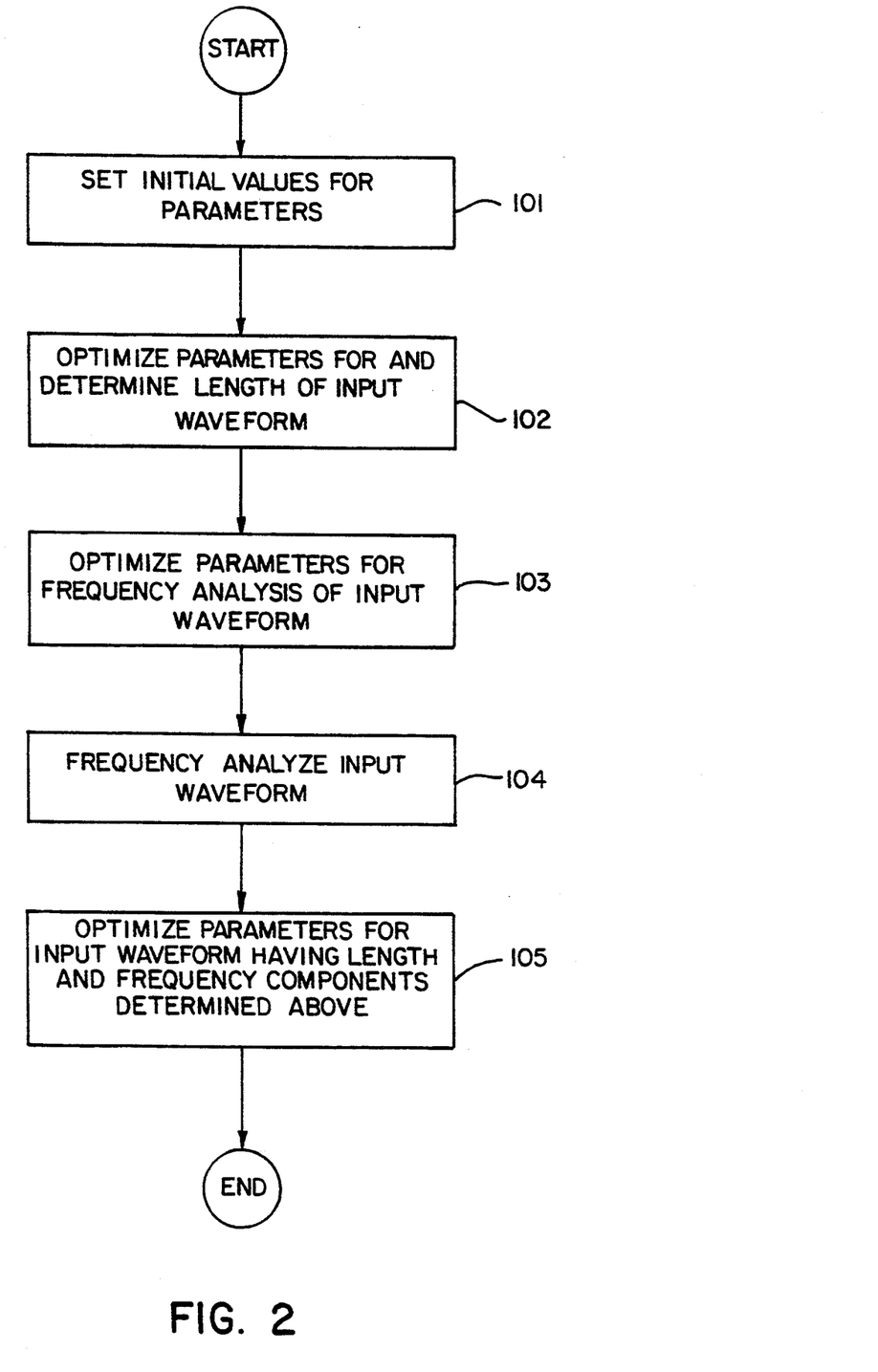
FIG. 2 is a flow chart showing the basic functions performed by the CPU of FIG. 1.

The CPU under control of its program performs five general functions, as shown in the flow chart of FIG. 2. First, initial values for the data acquisition parameters of the data acquisition system, including sampling rate, trigger level, voltage range, pre-trigger amount, and record length (number of points) are set in step 101. Second, the data acquisition parameters are adjusted to the optimal values for acquiring and determining the length of the input waveform, and the length of the input waveform is determined in step 102 to assure that later acquisitions acquire a sufficient portion of the input waveform. Third, the acquisition parameters are adjusted to the optimal values for acquiring and frequency analyzing the input waveform in step 103. Fourth, the data is frequency analyzed to determine the highest frequency component present in the waveform in step 104. Finally, the sampling rate, record length and pre-trigger amount are adjusted at step 105 to the optimal values for the input signal, i.e., a signal having the length and maximum frequency components determined in steps 102 and 104. In this manner, the CPU determines the optimal acquisition parameters for the periodic input waveform being acquired and studied. For signals that cycle continuously, such as sine waves, square waves, and so forth, the present invention recognizes that all of the waveform information is contained within one cycle of the waveform, and the acquisition parameters are set accordingly. The digital data acquisition system then acquires the input waveform, using the acquisition parameters determined above, for storage and analysis.

Figure 3:
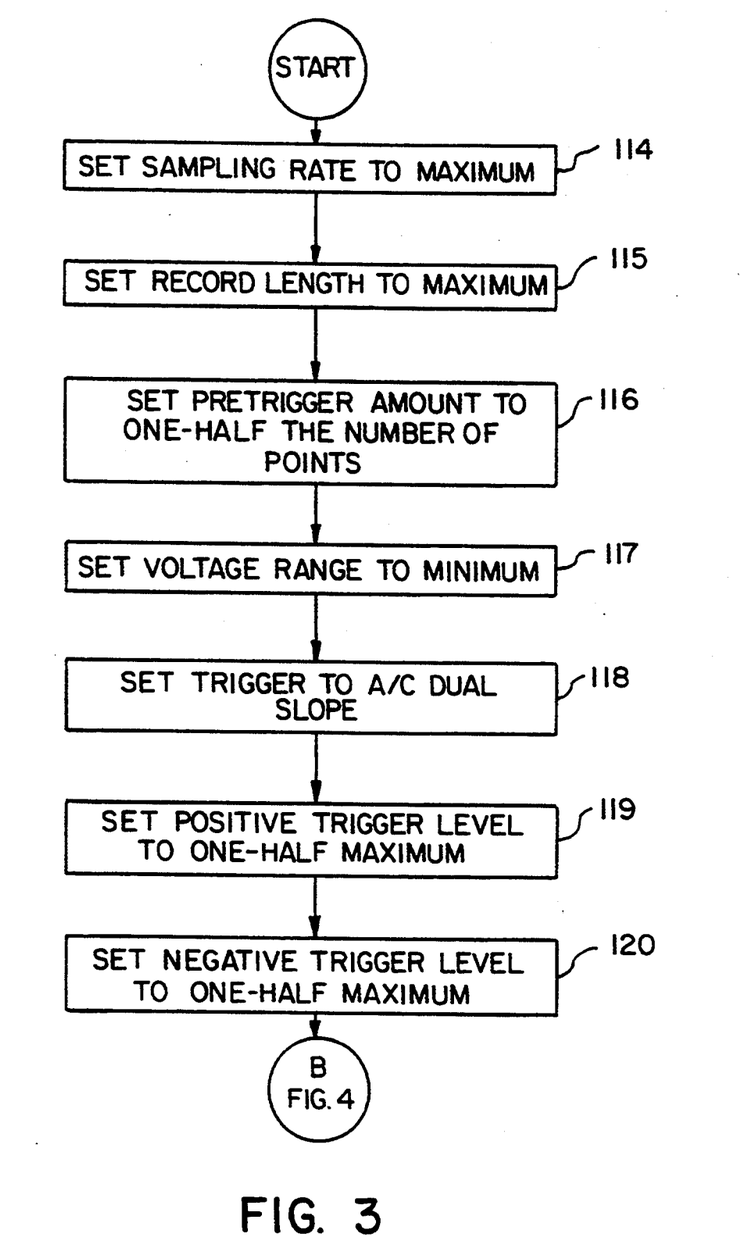
FIG. 3 is a flow chart of the instructions executed by the CPU of FIG. 1 when the first basic function shown in FIG. 2 is performed.

FIGS. 3–6 are flow charts showing the steps carried out by the CPU under the control of its program for accomplishing the functions of steps 101 through 105. Referring to FIG. 3, the detailed steps to provide initial values for the data acquisition parameters (block 101 in FIG. 2) are shown. In step 114 the sampling rate of the converter 32 is set to the maximum possible and in step 115 the number of points stored in the waveform memory 35 is set to the maximum possible. These setting are optimal for an input waveform that is rapidly changing and has a short length. The CPU later slows down the sampling rate if the input waveform is of a longer duration and/or changes less rapidly, as described further below. In step 116 the pre-trigger amount is set to one-half the number of points, on the assumption that the trigger event occurs half way through the waveform. In step 117 the voltage range of the A to D converter 32 (and/or of the signal conditioning circuitry 31, where appropriate) is set to the minimum possible value, which is optimal for an input waveform that has a relatively small peak-to-peak magnitude. If the peak-to-peak magnitude of the input waveform is not relatively small, the CPU later increases the voltage range. Preferably, an AC trigger mode is used to eliminate DC offsets from the trigger signal as is generally understood in the art. In step 118 the trigger generator 33 is set to trigger A/C dual slope, and in steps 119 and 120 the positive and negative trigger levels, respectively, for the trigger generator 33 are set to one-half their maximum values. For example, if the ADC 32 is an 8-bit ADC, the maximum positive level is 127 and the minimum negative level is −128, and therefore, the positive and negative trigger levels are set at the input voltage equivalent to +64 and −64, respectively. If the input waveform does not cross the trigger level, the CPU later lowers the trigger levels. Other initial values than those described above may be used, since the CPU later adjusts these values as necessary. For example, the voltage range could initially be set to the maximum and then later adjusted downwardly.

Figure 4A:
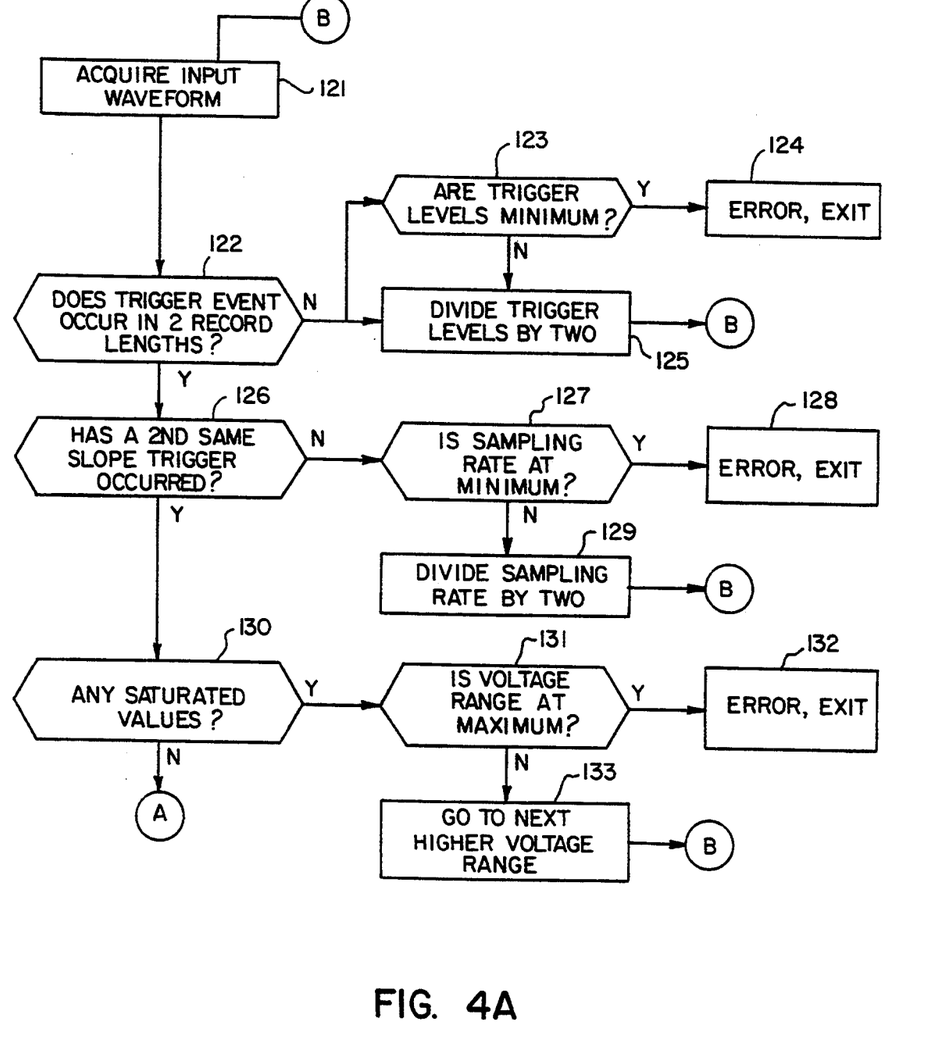
FIGS. 4A and 4B are a flow chart of the instructions executed by the CPU of FIG. 1 when the second basic function shown in FIG. 2 is performed.
Figure 4B:
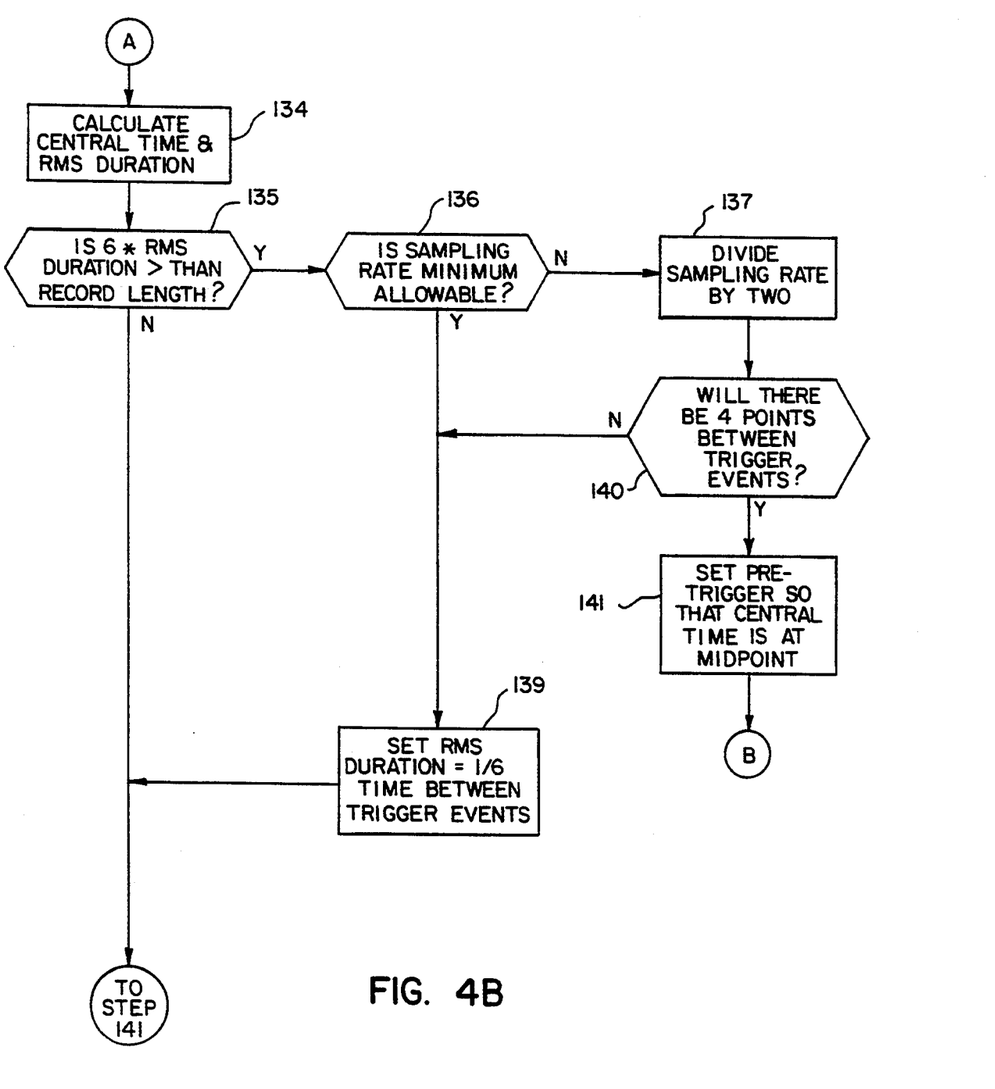

Following the setting of the initial values, the CPU then adjusts the acquisition parameters to the optimal values for determining the length of the input waveform in step 102. This is accomplished using an iterative process wherein the waveform is first acquired, then the acquired data is examined to determine if the acquisition parameters are optimal to determine the length of the input waveform, next the acquisition parameters are adjusted if necessary, and then data is reacquired, and so on. FIGS. 4A and 4B are a flow chart showing the step 102 in detail.

Referring now to FIG. 4A, the input waveform is first acquired at 121. The CPU then analyzes the acquired data and determines if a trigger event has occurred within two passes through the number of points in the record length at decision point 122. In accordance with the preferred embodiment, if a trigger event has not occurred within twice the number of points, it is assumed that the trigger levels are too high, and should be reduced in magnitude. Of course, as one skilled in the art would readily recognize, it is possible to wait either a greater or a shorter length of time (number of points) for a trigger event to occur.

If a trigger event does not occur within two passes through the number of points at 122, the CPU attempts to decrease the magnitude of the trigger levels. This is accomplished by determining if the trigger levels are at their minimum possible settings at decision point 123, and, if they are not, then adjusting them downward by a factor of two in step 125, i.e. from ±64 to ±32. After reducing the trigger levels in step 125, the program returns to step 121 to cause the system to reacquire data and then check the new trigger levels in steps 122-125. This process will be repeated until an appropriate trigger level is obtained or the trigger level is set to its minimum setting. Thus, in steps 121-125 the trigger levels are adjusted downward from their initial high setting to one at which a trigger event occurs. If, at decision point 123 the trigger levels are at their minimum possible settings, the program returns an error and exits in step 124 because the trigger levels cannot be set low enough to have a trigger event occur.

After adjusting the trigger levels to appropriate settings a trigger event will be found at decision point 122 and the program proceeds to decision point 126 where it determines if a second trigger event having the same slope occurs (i.e., the input waveform crosses the trigger level at least one more time in the same direction) within the number of points acquired. This helps to assure that at least one complete cycle of the input waveform is acquired. If a second same-slope trigger event has not occurred, indicating that one complete cycle of the input waveform has not been acquired, the CPU attempts to increase the time spanned by the acquisition so that a complete waveform may be acquired. This is accomplished by determining if the sampling rate is set at its minimum possible value at decision point 127, and if not, dividing the sampling rate by two in step 129, thereby doubling the time between points and hence doubling the length of time that the acquisition spans. After adjusting the sampling rate the CPU returns to step 121 where data is reacquired and the process repeated by readjusting the trigger levels in steps 121-125 (if necessary) and re-evaluating trigger levels at decision point 126. The CPU repeats steps 121-129 until the trigger levels are low enough for a trigger event to occur and the sampling rate is slow enough to allow the entire input waveform to be acquired.

If, at decision point 127 the sampling rate was at the minimum allowable, the CPU returns an error and exits the program in step 128 because the minimum sampling rate is not slow enough to allow the acquisition of one complete waveform, even using the maximum number of points possible.

After appropriately adjusting the trigger levels and the sampling rate, the CPU, at decision point 130, determines if there are any data points having saturated values (i.e., a data point equal to the full maximum or full minimum values). The presence of any data points having a saturated value indicates that the input waveform may have been clipped (i.e., the voltage range was not great enough to measure the maxima or minima of the input waveform). If, at decision point 130 there are saturated values, the CPU attempts to increase the voltage range. This is accomplished by determining, at decision point 131, if the voltage range is at the maximum possible value, and if not, adjusting the voltage range upward in step 133 to the next higher voltage range. After adjusting the voltage range, the CPU returns to step 121 to reacquire the input waveform, readjust the trigger levels, and readjust the sampling rate in steps 121-129. The voltage range is then rechecked at decision point 131. The CPU repeats steps 121-133 until the trigger levels are low enough for a trigger event to occur, the sampling rate is slow enough to allow the entire input waveform to be acquired, and the voltage range is large enough to prevent clipping of the input waveform.

If the voltage range was at the maximum possible at decision point 131, the CPU returns an error in step 132 and exits the program because the data acquisition system cannot acquire the input waveform without clipping it, even when the voltage range is set to its maximum possible range.

After setting the trigger levels, sampling rate and voltage range in steps 121-133, the CPU determines the central time and the rms duration of the input waveform in step 134 of FIG. 4B. The central time of a waveform is analogous to the mean of a probability distribution function, and the rms duration of a waveform is analogous to the standard deviation of a probability distribution function. In other words, more than 99.9% of the waveform information is contained within ±3 rms durations of the central time, just as greater than 99.9% of a probability distribution is contained within ±3 standard deviations of its mean. Definitions for central time and RMS duration may be found in *Characterizing Transient Vibrations Using Band Limited Moments*, David O. Smallwood, Proceedings, 60th Shock and Vibration Symposium, November, 1989, incorporated herein by reference and as described below. The central time and rms duration are later used by the CPU to determine if the entire input waveform has been acquired.

The moments (of a time history) are analogous to the moments of probability density functions. The square of the time history is used because of useful properties, relating time and frequency, between the time moments and moments in the frequency domain.

The moment i, $m_i(a)$, of a time history, $f(t)$, about a time location, a, will be defined as $$m_i(a) = \int_{-\infty}^{\infty} (t-a)^i [f(t)]^2 \, dt \quad (1)$$

The moments prove to be very useful to describe simple time history shapes and to describe the envelopes of more complicated time histories.

Two special cases are defined. First, if the time shift, a, is zero the argument will be dropped for simplicity.

$$m_i(0) = m_i. \quad (2)$$

Second, the central moments are defined about a value, that produces a zero first moment, i.e.

$$m_1(\tau) = \int_{-\infty}^{\infty} (t-\tau)[f(t)]^2 \, dt = 0. \quad (3)$$

Solving this equation for $\tau$ gives, $$\tau = m_1/m_0. \quad (4)$$

The first five moments (0–4) about $\tau$ are of special interest and will be given special names. The zero order moment is independent of the shift, a, $$m_0(a) = m_0. \quad (5)$$

This value is the integral of the magnitude squared of the time history and is called the time history energy. Assume the energy is finite. The energy in the time domain is related to the energy in the frequency domain through the Fourier transform. Let $F(\omega)$ be the Fourier transform of f(t). Then Parseval's formula gives, $$\int_{-\infty}^{\infty} |f(t)|^2 \, dt = \frac{1}{2\pi} \int_{-\infty}^{\infty} |F(\omega)|^2 \, d\omega. \quad (6)$$

This value is given the symbol E, $$E = m_0. \quad (7)$$

The magnitude squared of the Fourier spectrum, $|F(\omega)|^2$, is called the energy spectrum, and is labeled $\Phi$.

Note the following regarding the units of energy and energy spectrum: The Fourier transform of a time history has units of engineering units (EU)—sec, (EU·s) or EU/Hz. The units of the energy spectrum are (EU/Hz)$^2$ or (EU·sec)$^2$. Units of the energy are (EU/Hz)$^2$·Hz or (EU)$^2$·sec, for example, g$^2$s. The units should be for a classical two sided spectrum although we seldom plot the energy at negative frequencies. Sometimes the spectra in the literature are for single sided spectra which differs from the two sided spectra by a factor of 2 everywhere except at zero frequency, where they are the same. Spectra are usually calculated with a DFT or FFT. These routines don't always normalize the Fourier spectra by dividing by the frequency increment and thus result in energy spectra with units of (EU)$^2$.

As discussed earlier, the first moment normalized by the energy gives the time where the centroid of the energy is located (Eq. 4) and is called the central time, $\tau$. Since the origin of the time axis is often arbitrary, the central time is often important only in a relative sense. The higher moments are also calculated around the central time for convenience and to make the parameters independent of the time origin.

The second central moment normalized by the energy is defined as the mean square duration, $D^2$, of the time history.

$$D^2 = m_2(\tau)/E. \quad (8)$$

The rms duration, D, is useful to describe the duration of complex waveforms where more conventional definitions of duration are difficult to apply.

Relationships between the various moments can be easily derived and are stated below.

$m_0 = E$ $m_1 = E\tau$ $m_2 = E(D^2 + \tau^2)$ $E = m_0$ $\tau = m_1/m_0$ $D^2 = (m_2/m_0) - (m_1/m_0)^2$ $m_0(a) = m_0 = E$ $m_1(a) = m_1 - am_0 = E(\tau - a)$ $m_2(a) = m_2 - 2am_1 + a^2 m_0 = E[D^2 + \tau^2 - 2a\tau + a^2]$ From the above expressions, it is clear that $m_2(a)$ is a minimum when $a = \tau$. This is the reason the rms duration, D, is defined by the second moment about $\tau$.

At a decision point 135, the CPU 37 determines if six times the rms duration is greater than the number of points in the record (the record length). If 6 times the rms duration is greater than the record length, then less than 99.9% of the waveform has been acquired and, conversely, if 6 times the rms duration is not greater than the record length, then 99.9% or more of the waveform has been acquired. If less than 99.9% of the waveform was acquired (a YES at decision point 135) the CPU attempts to increase the acquisition time so that more of the waveform may be acquired. This is accomplished by determining if the sampling rate is the minimum allowable at decision point 136 and, if not, by adjusting the sampling rate downward by a factor of two in step 137. This increases the time between data points acquired, and therefore increases the acquisition time and the likelihood that 99.9% of the waveform will be acquired.

Because a slow sampling can result in a "visually displeasing" display, the CPU, after adjusting the sampling rate in step 137, determines if substantially all of the waveform duration is acquired within the available memory size and that a sufficient number of points are acquired per cycle so that a "visually pleasing" display is provided at decision point 140. Four data points between successive same slope trigger level crossings are generally sufficient to ensure that a "visually pleasing" display will occur. Although the waveform need not be displayed at this time, it could be. One skilled in the art will recognize that, in the strict mathematical sense, only two points between successive same slope trigger level crossings are necessary. Alternatively, more than four points could be required.

If there will be at least four data points between successive same slope trigger level crossings as determined at 140, the CPU sets the pre-trigger amount at 141 so that the central time of the waveform will be located at the midpoint of the next acquisition at the decision point 140 and then returns to step 121 (FIG. 4A) and reacquires the input waveform.

If, at the decision points 136 and 140, the sampling rate is at the minimum allowable rate or there will not be at least four samples in the time span between two trigger level crossings, it is assumed that the input signal is continuous, such as a sinusoid, etc., rather than comprised of repetitive pulses such as tone bursts. Because continuous waveforms have infinite rms durations, the sampling rate can never be slow enough to acquire a number of points equal to 6 times the rms duration, as required at decision point 135. However, since all information in a continuous periodic waveform will be contained within one cycle, and setting the rms duration equal to 1/6 of one cycle will still result in 99.9% or more of the waveform information being acquired within 6 times the rms duration, the CPU proceeds to step 139 where the rms duration is set equal to one-sixth the time between successive same slope trigger level crossings. This ensures that when the CPU later analyzes the input waveform normalized according to six times its rms duration, the normalization will be done for one complete cycle.

Steps 134 to 141 are repeated until the CPU determines trigger levels at which a trigger event occurs, a voltage range at the minimum level that prevents clipping, the fastest sampling rate at which at least 99.9% of the input waveform will be acquired, and an rms duration equal to one-sixth of the acquired waveform's length.

After determining the length and rms duration of the input waveform at step 134 and determining that 6 times the rms duration is less than the record length at decision point 135, or that the input waveform is continuous and the rms duration is equal to one-sixth of a cycle at step 139, the CPU has completed its determination of the input waveform using optimal acquisition parameters. The CPU then proceeds to the steps shown in FIG. 5 where the acquisition parameters are optimized for frequency analysis.

Figure 5:
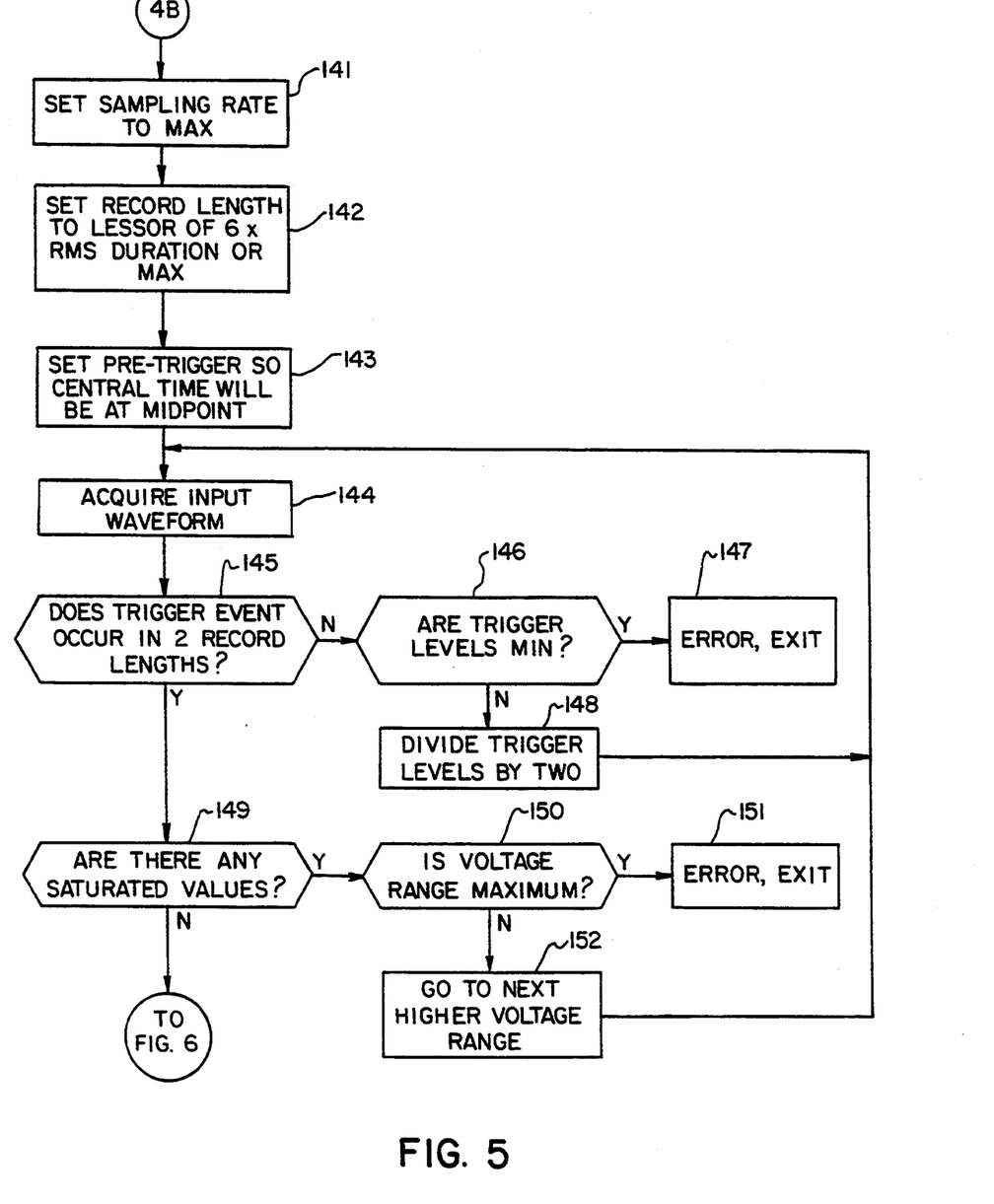
FIG. 5 is a flow chart of the instructions executed by the CPU of FIG. 1 when the third basic function shown in FIG. 2 is performed.

FIG. 5 shows in detail the steps carried out in the optimization of acquisition parameters at 103 in FIG. 2. The CPU first resets the sampling rate to the fastest possible rate in step 141. Then the CPU sets the record length to equal 6 times the rms duration determined at step 142, or the maximum record length, whichever is shorter, and proceeds to step 143 and sets the pre-trigger amount so that the central time of the waveform will be located at the midpoint of the next acquisition. The CPU then proceeds to acquire waveform data in step 144. Using the length and central time determined in the manner described above will result in at least 99.9% of the waveform information being recorded.

At a decision point 145 the CPU determines if there is a trigger event within two passes through the maximum number of points in the record at the sampling rate selected in step 141. Generally, two passes through the number of points should be a sufficient length of time to wait for a trigger event. Of course, the length of time that is allowed to pass before a trigger event occurs may be altered. In steps 146–148 the trigger level is adjusted downward until either a trigger event occurs or the minimum level is reached and an error is returned.

After setting the trigger levels in steps 145–148, the CPU proceeds to decision point 149 to determine if any of the data points have saturated values. If there are saturated values, the CPU adjusts the voltage range upward in steps 150 through 152, and returns to step 149 until the optimal trigger levels and voltage range are reached, or an error is returned.

After reaching the optimal trigger levels and voltage range, the CPU then proceeds to frequency analyze the input waveform (step 105 of FIG. 2). The spectral analysis is normalized for the number of points in 6 times the rms duration, not the record length because the number of points in the waveform is equal to 6 times the rms duration, which is not necessarily the record length. The CPU carries out the steps shown in detail in FIG. 6 to optimize the acquisition parameters for an input waveform having the length and frequency components previously determined. In step 153 the CPU performs spectral analysis on the waveform data (e.g., by performing a well known conventional fast Fourier transform algorithm) to produce a spectrum. Preferably, the CPU carries out a discrete Fourier transform of the points spanned by six rms durations, followed by the normalization of the magnitude in each frequency bin by 2/(number of points in six rms durations). The DC term is normalized by 1/(number of points in six rms durations). In step 154, the CPU determines the maximum allowable aliasing level. Some typical maximum aliasing levels are one-half the least significant bit (LSB) or (1 LSB)$^2$/12. Other techniques for determining the maximum allowable aliasing level are well known in the art. After determining the maximum allowable aliasing level, the spectrum of the input waveform is examined and the frequency at which the spectral amplitude at all higher frequencies is less than the maximum allowable aliasing level is determined at 155 (i.e. the greatest frequency at which the amplitude is greater than the maximum allowable aliasing level). In step 156, sampling rate is set to at least twice the frequency obtained in step 155, to ensure that aliasing will be less than the maximum allowable level. If there is no frequency in the spectrum for which this criterion is met, the input signal cannot be sampled without aliasing at the highest possible sampling rate, and the acquisition equipment being used is not adequate.

Figure 6:
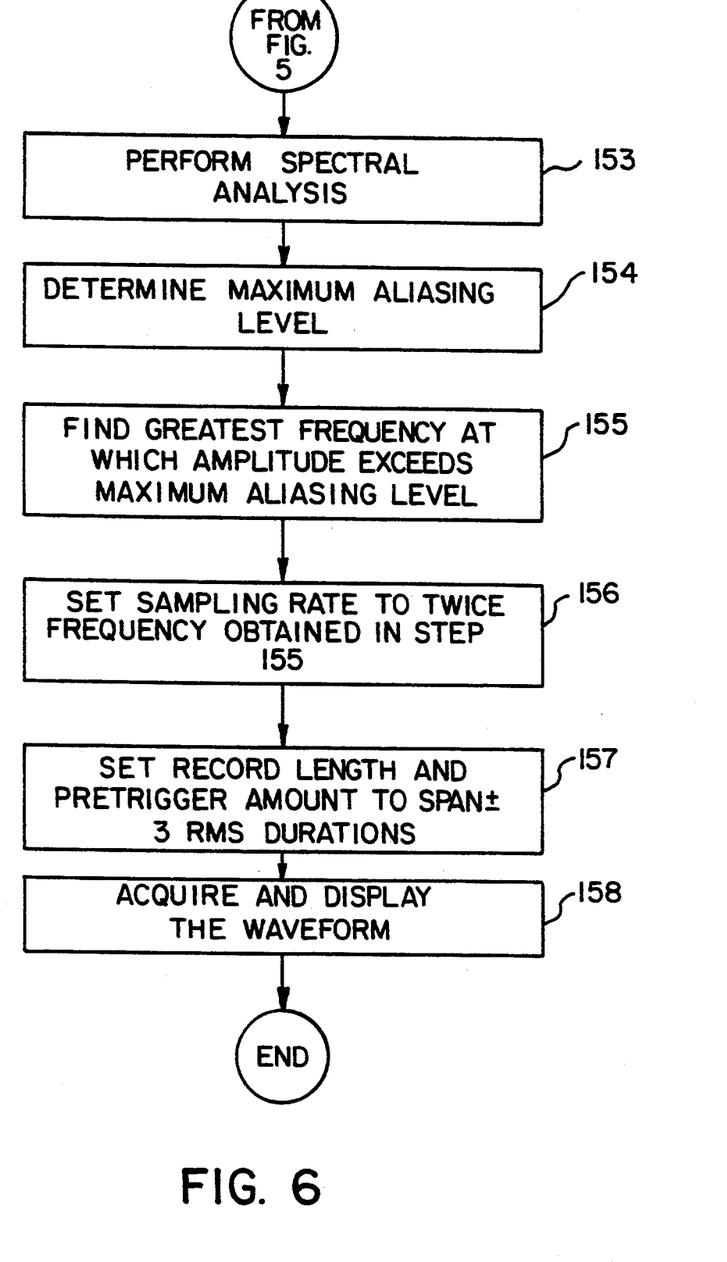
FIG. 6 is a flow chart of the instructions executed by the CPU of FIG. 1 when the fourth basic function shown in FIG. 2 is performed.

After determining the sampling rate, the CPU sets the record length and pre-trigger amount to span plus or minus 3 times the rms duration in step 157. At this point the CPU has determined a sampling rate, a pre-trigger amount, a voltage range, a record length, and trigger levels which allow the input waveform to be acquired in its entirety and without aliasing. These parameters are then used to acquire and display the waveform in the usual fashion, as indicated at 158.

It is understood that the invention is not confined to the particular embodiment set forth herein as illustrative, but embraces such modified forms thereof as come within the scope of the following claims.

What is claimed is:

1. A method of adjusting the acquisition parameters in a data acquisition system having a maximum sampling rate, and memory capacity, to accommodate a repetitive input signal waveform, comprising the steps of:

(a) setting initial values for acquisition parameters including sampling rate and the record length of the record in the memory of the data acquisition system;

(b) using the initial acquisition parameters, acquiring and reacquiring an input signal waveform and providing digital data corresponding to the waveform and adjusting the sampling rate until a full cycle of the waveform data fits the record length in the memory;

(c) then analyzing the acquired waveform data to determine the duration of the input waveform;

(d) then setting the sampling rate to a maximum and reacquiring the input waveform and storing input waveform data in the memory which corresponds to at least the previously determined duration of the input platform, and then determining frequency content of the waveform data in the memory; and (e) adjusting the acquisition parameters so that for the repetitive input waveform, the sampling rate is sufficient to avoid aliasing of the highest significant frequency components of the input waveform while accommodating substantially all of the waveform within the memory capacity of the memory.

2. The method of claim 1 wherein the step of analyzing the acquired waveform data to determine the duration is carried out to determine the rms duration of the waveform.

3. The method of claim 2 wherein the record length is set equal to six times the rms duration.

4. The method of claim 1 wherein the step of setting initial acquisition parameters includes setting a trigger level, voltage range for the input signal, and pretrigger amount of data to be stored in the memory.

5. The method of claim 4 including the additional steps of initially setting the voltage range to a minimum and determining if any acquired data values are saturated, and, if so, reacquiring waveform data repetitively while increasing the voltage range for each new acquisition until no acquired data values are saturated.

6. The method of claim 4 wherein the pretrigger is initially set to one-half the number of data points in the memory record length and the trigger levels are set to positive one-half and negative one-half of the maximum positive and negative trigger levels, and including the steps of reacquiring waveform data repetitively and decreasing the trigger levels after each acquisition until a trigger event occurs within a selected number of record lengths of the acquired data.

7. The method of claim 6 wherein after a trigger level is found, determining if a second same slope trigger has occurred in one record length and, if not, decreasing the sampling rate and reacquiring waveform data repetitively until two trigger events occur in one record length.

8. The method of claim 4 including determining the central time of the waveform and setting the pretrigger for data stored in the memory prior to the trigger level equal to a selected percentage of the record length at a selected position with respect to the central time of the waveform.

9. The method of claim 8 wherein the pretrigger point is set such that the central time is at one-half the record length of the data in the waveform memory.

10. A method of setting the acquisition parameters for a data acquisition system which receives an input signal containing a repetitive waveform and which has a memory in which digital data sampled from the input waveform is stored, the data acquisition system having a maximum sampling rate, memory capacity, and voltage range, comprising the steps of:

(a) setting initial values for the acquisition parameters, including setting the sampling rate to maximum, setting the record length stored in the memory to the maximum capacity of the memory, setting a pretrigger to one-half of the points in the memory, setting a voltage range on the input signal to maximum, and setting a trigger level to a selected level;

(b) acquiring waveforms from the input signal repetitively, adjusting the voltage range to accept the full range of the input signal with no saturated values, finding a trigger level of the input signal, and then acquiring a waveform and calculating the central time and rms duration of the waveform;

(c) setting the record length for the data to be stored in the waveform memory and the pretrigger amount in accordance with the rms duration and the central time calculated for the waveform; then (d) acquiring another waveform from the input signal, searching for a trigger level and adjusting the voltage range so that the input waveform will be within the range of the system and without any saturated values, then performing spectral analysis on the waveform data acquired to provide a spectrum and determining from the spectrum the maximum significant frequency content of the waveform, then setting the sampling rate such that the waveform is sampled without aliasing, based upon the maximum significant frequency content and then setting the record length in the memory and the pretrigger amounts so as substantially to span plus or minus 3 rms durations of the waveform.

11. The method of claim 10, wherein the step of acquiring another waveform and performing spectral analysis includes performing a discrete Fourier transform of the points in the plus or minus 3 rms durations, followed by normalizing the magnitude in each frequency bin.

12. The method of claim 11, wherein the normalizing the magnitude step includes dividing the number two by the number of points in the plus or minus 3 rms durations.

13. The method of claim 12, wherein the normalizing step includes normalizing the DC term by dividing the number one by the number of points in the plus or minus 3 rms durations.

14. A method of determining the length of a waveform in an input signal that is received repetitively by a data acquisition system, comprising the steps of:

(a) setting initial acquisition parameters for the data acquisition system including sampling rate, record length of the data to be stored in a memory of the data acquisition system, a pretrigger amount of data points to be stored in the memory prior to the occurrence of a trigger event, a selected initial trigger level, and a voltage range;

(b) acquiring a waveform repetitively from the input signal and finding a trigger level which occurs within the record length of the waveform, determining a sampling rate such that two triggers occur within the total range of data acquired, adjusting the voltage range to accept the input signal with no saturation of the sampled values of the input waveform, and then calculating the central time and rms duration of the waveform in the input signal; and (c) setting the record length equal to a selected multiple of the calculated rms duration.

15. The method of claim 14, wherein the acquiring a waveform repetitively from the input signal step further includes assuming that the input signal is a continuous waveform when the sampling rate is at a minimum allowable rate and setting acquisition parameters accordingly.

16. The method of claim 14 wherein the record length is set equal to six times the rms duration.

17. The method of claim 14 including setting the pretrigger for data stored in the memory prior to the trigger event equal to a selected percentage of the record length at a selected position with respect to the central time of the waveform.

18. The method of claim 17 wherein the pretrigger point is set such that the central time is at one-half of the record length of the data in the waveform memory.

19. Digital oscilloscope apparatus comprising:
(a) a waveform memory having a maximum memory capacity;
(b) sampling means for sampling a time varying input signal to produce digital data corresponding to the waveform of the signal and storing the data in the waveform memory, the sampling means having a maximum sampling rate and input voltage range;
(c) display means for receiving digital data to provide a visual display of the waveform corresponding to the received data on a display screen;
(d) trigger generator means for receiving the input signal and providing a trigger signal at a selected trigger level;
(e) CPU control means for controlling the waveform memory, sampling means, the display means, and the trigger generator means, for setting initial values for acquisition parameters for the input signal waveform including sampling rate, trigger level, voltage range, pretrigger amount and the length of the record in the waveform memory of the data acquisition system, for using the initial acquisition parameters to acquire data corresponding to an input waveform, and for analyzing the acquired waveform data and reacquiring the input waveform repetitively to determine the length of the input waveform, the voltage range of the waveform, and the frequency content of the waveform, and for adjusting the acquisition parameters so that for the input waveform, the voltage range allows all waveform data to be acquired without saturation, the sampling rate is sufficient to avoid aliasing of the highest significant frequency components of the input waveform while accommodating all or substantially all of the waveform within the memory capacity of the waveform memory at a selected trigger level and pretrigger amount.

20. Digital oscilloscope apparatus comprising:
(a) a waveform memory having a maximum memory capacity;
(b) sampling means for sampling a time varying input signal to produce digital data corresponding to the waveform of the signal and storing the data in the waveform memory, the sampling means having a maximum sampling rate and input voltage range;
(c) display means for receiving digital data to provide a visual display of the waveform corresponding to the received data on a display screen;
(d) trigger generator means for receiving the input signal and providing a trigger signal at a selected trigger level;
(e) CPU control means for controlling the waveform memory, the means for sampling, the display means and the trigger generator means, for setting initial values for the acquisition parameters for acquiring a waveform, including setting the sampling rate of the sampling means to its maximum, setting the record length stored in the waveform memory to the maximum capacity of the memory, setting a pretrigger to one-half of the points in the memory, setting a voltage range on the input signal to the sampling means to a maximum, and setting a trigger level in the trigger generator to a selected level for acquiring waveforms from the input signal repetitively, adjusting the voltage range of the sampling means to accept the full range of the input signal with no saturated values, for finding a trigger level of the input signal, and then acquiring a waveform and calculating the central time and rms duration of the waveform, for setting the record length for the data to be stored in the waveform memory and the pretrigger amount in accordance with the rms duration and the central time calculated for the waveform, and for acquiring another waveform from the input signal, searching for a trigger level and adjusting the voltage range so that the input waveform will be within the range of the sampling means without any saturated values, for then performing spectral analysis on the waveform data acquired to provide a spectrum and determining from the spectrum the maximum significant frequency content of the waveform, for then setting the sampling rate of the sampling means such that the maximum significant frequency content of the waveform is sampled without aliasing and then setting the record length in the memory and the pretrigger amounts so as substantially to span plus or minus 3 rms durations of the waveform.

21. Digital oscilloscope apparatus comprising:
(a) a waveform memory having a maximum memory capacity;
(b) sampling means for sampling a time varying input signal to produce digital data corresponding to the waveform of the signal and storing the data in the waveform memory, the sampling means having a maximum sampling rate and input voltage range;
(c) display means for receiving digital data to provide a visual display of the waveform corresponding to the received data on a display screen;
(d) trigger generator means for receiving the input signal and providing a trigger signal at a selected trigger level;
(e) CPU control means for controlling the waveform memory, the sampling means, the display means, and the trigger generator means, for setting initial acquisition parameters including the sampling rate of the sampling means, the record length of the data to be stored in the waveform memory, a pretrigger amount of data points to be stored in the memory prior to the occurrence of a trigger event, a selected initial trigger level in the trigger generator means, and the voltage range of the sampling means, for then acquiring a waveform repetitively from the input signal and finding a trigger level which occurs within the record length of the waveform, for determining a sampling rate such that two triggers occur within the total range of data acquired, for adjusting the voltage range to accept the input signal with no saturation of the sampled values of the input waveform in the sampling means for calculating the central time and rms duration of the waveform in the input signal, and for setting the record length equal to a selected multiple of the calculated rms duration.

22. The apparatus of claim 21 wherein the CPU control means sets the record length equal to six times the rms duration.

23. The apparatus of claim 21 wherein the CPU control means sets the pretrigger for data stored in the memory prior to the trigger event equal to a selected percentage of the record length at a selected position with respect to the central time of the waveform.

24. The apparatus of claim 23 wherein the pretrigger point is set such that the central time is at one-half of the record length of the data in the waveform memory.

* * * * *

UNITED STATES PATENT AND TRADEMARK OFFICE
CERTIFICATE OF CORRECTION

PATENT NO.  :  5,375,067
DATED       :  December 20, 1994
INVENTOR(S) :  Gregory J. Berchin It is certified that error appears in the above-indentified patent and that said Letters Patent is hereby corrected as shown below:

In column 1, line 43 of the patent, "to acquire" should be --reacquire--,

In column 3, line 3 of the patent, "lines The" should be --lines 41. The--,

In column 3, line 21 of the patent, --unit-- should be inserted before "40",

In column 3, line 22 of the patent, --by-- should be inserted after "unit",

In column 3, lines 22 and 23 of the patent, --50-- should be inserted after "and" and before "extending", In column 6, line 18 of the patent, "net" should be --not--, In column 7, line 15 of the patent, --$\tau$,-- should be inserted after "value,"

In column 7, line 20 of the patent, "$\pi$" should be --$\tau$--,

UNITED STATES PATENT AND TRADEMARK OFFICE
CERTIFICATE OF CORRECTION

PATENT NO. : 5,375,067
DATED : December 20, 1994
INVENTOR(S) : Gregory J. Berchin It is certified that error appears in the above-indentified patent and that said Letters Patent is hereby corrected as shown below:

In column 7, line 22 of the patent, "$\pi$" should be --$\tau$--,

In column 7, line 24 of the patent, "$\pi$" should be --$\tau$--,

In column 7, line 66 of the patent, "$\pi$." should be --$\tau$.--,

In column 8, line 7 of the patent, "$\pi$" should be --$\tau$--,

In column 8, line 17 of the patent, "$\pi$" should be --$\tau$--,

In column 8, line 19 of the patent, "$\pi$" should be --$\tau$--,

In column 8, line 22 of the patent, "$\pi$" should be --$\tau$--,

In column 8, line 28 of the patent, "$\pi$" should be --$\tau$--,

In column 8, line 30 of the patent, both occurrences of "$\pi$" should be --$\tau$--,

UNITED STATES PATENT AND TRADEMARK OFFICE
CERTIFICATE OF CORRECTION

PATENT NO. : 5,375,067
DATED : December 20, 1994
INVENTOR(S) : Gregory J. Berchin It is certified that error appears in the above-indentified patent and that said Letters Patent is hereby corrected as shown below:

In column 8, line 33 of the patent, "$\pi$" should be --$\tau$--,

In column 8, line 34 of the patent, "$\pi$" should be --$\tau$--,

In column 11, line 13 of the patent, "platform" should be --waveform--

In column 11, line 60 of the patent, --of-- should be inserted after "one-half", Signed and Sealed this Nineteenth Day of March, 1996

Attest:

BRUCE LEHMAN

*Attesting Officer*     *Commissioner of Patents and Trademarks*